United States Patent
Tokuda et al.

(10) Patent No.: US 11,699,983 B2
(45) Date of Patent: Jul. 11, 2023

(54) DIRECTIONAL COUPLER

(71) Applicant: Murata Manufacturing Co., Ltd., Kyoto (JP)

(72) Inventors: Daisuke Tokuda, Kyoto (JP); Ryangsu Kim, Kyoto (JP); Yasushi Shigeno, Kyoto (JP); Katsuya Shimizu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/032,281

(22) Filed: Sep. 25, 2020

(65) Prior Publication Data

US 2021/0013858 A1   Jan. 14, 2021

Related U.S. Application Data

(63) Continuation of application No. PCT/JP2019/012956, filed on Mar. 26, 2019.

(30) Foreign Application Priority Data

Mar. 28, 2018   (JP) .................................. 2018-062240

(51) Int. Cl.
*H03H 7/40* (2006.01)
*H01P 5/18* (2006.01)

(52) U.S. Cl.
CPC ................ *H03H 7/40* (2013.01); *H01P 5/18* (2013.01)

(58) Field of Classification Search
CPC ..................................... H03H 7/40; H01P 5/18
See application file for complete search history.

(56) References Cited

U.S. PATENT DOCUMENTS

| | | | |
|---|---|---|---|
| 2016/0028420 A1* | 1/2016 | Srirattana | H04B 1/0458 455/127.2 |
| 2017/0302254 A1* | 10/2017 | McNamara | H04L 25/03885 |
| 2017/0324392 A1 | 11/2017 | Srirattana et al. | |
| 2018/0048046 A1 | 2/2018 | Noguchi et al. | |
| 2018/0062621 A1* | 3/2018 | Yan | H03G 3/3042 |
| 2018/0083601 A1* | 3/2018 | Morgan | H03H 7/38 |
| 2019/0245505 A1* | 8/2019 | Cheng | H05B 6/02 |

FOREIGN PATENT DOCUMENTS

| | | |
|---|---|---|
| CN | 107431264 A | 12/2017 |
| JP | H09-107212 A | 4/1997 |
| JP | 2007-194870 A | 8/2007 |
| JP | 2011-135363 A | 7/2011 |
| WO | 2016/158314 A1 | 10/2016 |

OTHER PUBLICATIONS

International Search Report for PCT/JP2019/012956 dated Jun. 18, 2019.
Written Opinion for PCT/JP2019/012956 dated Jun. 18, 2019.

* cited by examiner

*Primary Examiner* — Samuel S Outten
(74) *Attorney, Agent, or Firm* — Pearne & Gordon LLP

(57) ABSTRACT

A directional coupler (2) includes a main line (11), a sub-line (12), a variable terminator (13), and a variable filter circuit (15). The variable terminator (13) is a variable impedance circuit that terminates one end portion of the sub-line (12). The variable filter circuit (15) is connected to the other end portion of the sub-line (12). The variable filter circuit (15) may include a filter, a bypass path, and a switch which is connected to at least one of the filter and the bypass path.

7 Claims, 4 Drawing Sheets

FIG. 1
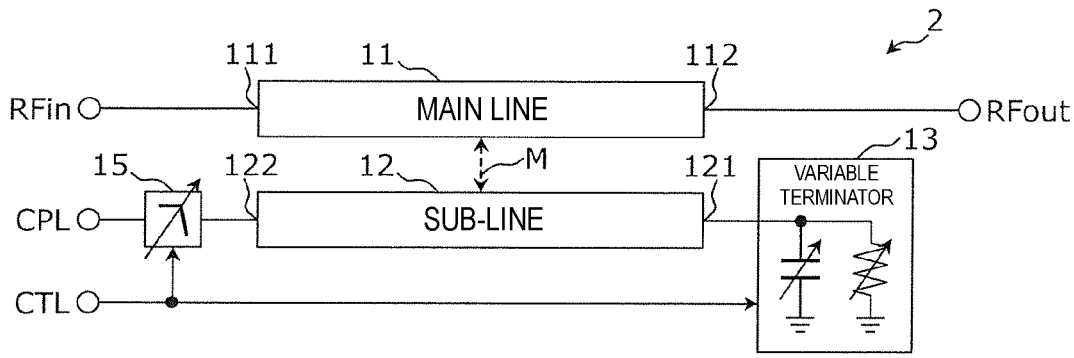
FIG. 2A
FIG. 2B
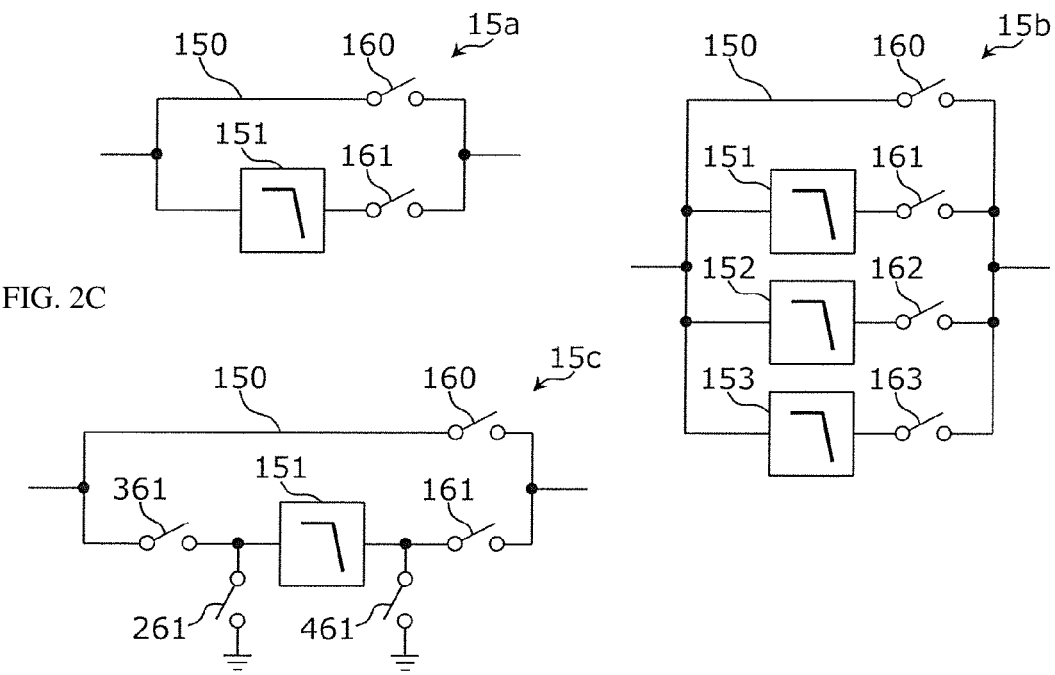
FIG. 2C
FIG. 3
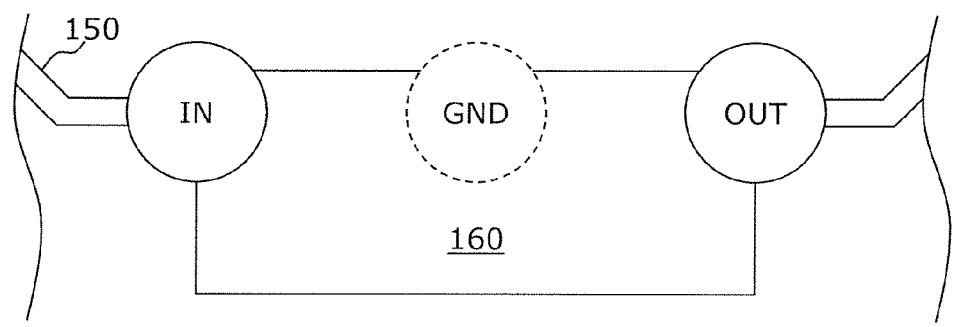

DIRECTIONAL COUPLER

This is a continuation of International Application No. PCT/JP2019/012956 filed on Mar. 26, 2019 which claims priority from Japanese Patent Application No. 2018-062240 filed on Mar. 28, 2018. The contents of these applications are incorporated herein by reference in their entireties.

BACKGROUND OF THE DISCLOSURE

Field of the Disclosure

The present disclosure relates to a directional coupler.

Description of the Related Art

Hitherto, a directional coupler including a variable impedance circuit connected to an isolation port of a sub-line is known (see Patent Document 1, for example). As a result of adjusting the impedance at the isolation port with the variable impedance circuit, an unwanted radio-frequency signal propagating through a main line in the direction opposite to the direction of a radio-frequency signal to be detected can be prevented from entering a coupling port, thereby improving the directivity.

Patent Document 1: U.S. Patent Application Publication No. 2017/0324392

BRIEF SUMMARY OF THE DISCLOSURE

Adjusting the impedance at the isolation port as desired, however, fails to provide impedance matching with the impedance at the coupling port. This increases the loss in the sub-line, which may lead to the degradation of the detection accuracy.

Additionally, in the directional coupler disclosed in Patent Document 1, although the directivity is improved, unwanted signal components contained in a radio-frequency signal in the direction to be detected and in a frequency band other than a frequency band to be detected may be outputted to the coupling port. This may also degrade the detection accuracy of the directional coupler.

It is an object of the present disclosure to provide a directional coupler that is able to adjust the impedance at an isolation port and also to suppress the degradation of the detection accuracy.

To achieve the above-described object, a directional coupler according to an aspect of the present disclosure includes a main line, a sub-line, a variable impedance circuit, and a variable filter circuit. The variable impedance circuit terminates one end portion of the sub-line. The variable filter circuit is connected to the other end portion of the sub-line.

In a directional coupler according to the present disclosure, the directivity can be stabilized by adjusting a variable impedance circuit. Additionally, as a result of adjusting a variable filter circuit, the impedance mismatching at a coupling port can be decreased and unwanted waves can be eliminated, thereby suppressing the degradation of the detection accuracy.

BRIEF DESCRIPTION OF THE SEVERAL VIEWS OF THE DRAWINGS

FIG. 1 is a circuit diagram illustrating an example of the functional configuration of a directional coupler according to a first embodiment.

FIGS. 2A, 2B and 2C show circuit diagrams of some examples of the functional configuration of a variable filter according to the first embodiment.

FIG. 3 is a schematic diagram illustrating an example of the structure of a switch according to the first embodiment.

DETAILED DESCRIPTION OF THE DISCLOSURE

Figure 4:
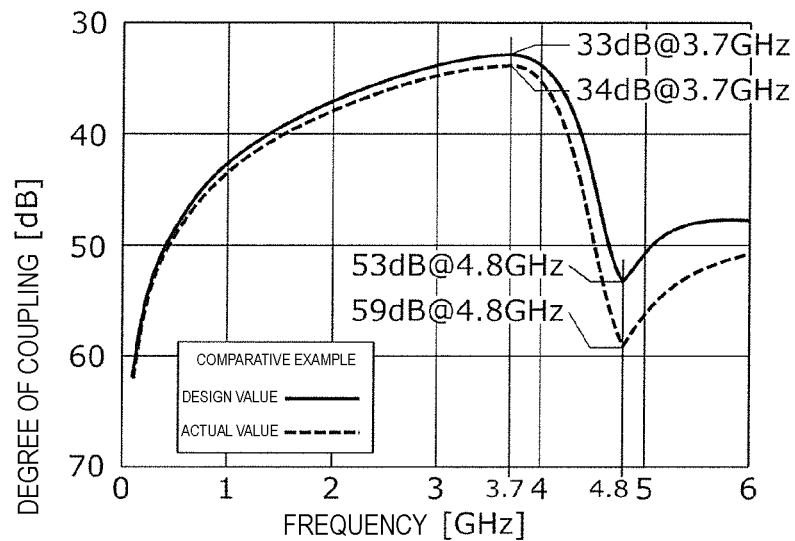
FIG. 4 is a graph illustrating an example of the degree of coupling of a directional coupler according to a comparative example.

Plural embodiments of the present disclosure will be described below in detail with reference to the drawings. All of the embodiments described below illustrate general or specific examples. Numeric values, configurations, materials, elements, and positions and connection states of the elements illustrated in the following embodiments are only examples and are not described for limiting the present disclosure.

First Embodiment

A directional coupler according to a first embodiment will be described below through illustration of a directional coupler including a variable impedance circuit connected to a first end of a sub-line and a variable filter circuit connected to a second end of the sub-line.

FIG. 1 is a circuit diagram illustrating an example of the functional configuration of a directional coupler 2 according to the first embodiment. As shown in FIG. 1, the directional coupler 2 includes a main line 11, a sub-line 12, a variable terminator 13, and a variable filter circuit 15. The main line 11 and the sub-line 12 are electromagnetically coupled with each other, as indicated by the broken-line arrow M in FIG. 1.

A first end 111 of the main line 11 is connected to an input port RFin, while a second end 112 of the main line 11 is connected to an output port RFout.

A first end 121 of the sub-line 12 is terminated by the variable terminator 13. A second end 122 of the sub-line is connected to a coupling port CPL via the variable filter circuit 15.

The first end 121 of the sub-line 12 is an example of the end portion of the sub-line at an isolation port. The second end 122 of the sub-line 12 is an example of the end portion of the sub-line at the coupling port. The variable terminator 13 may be connected to the second end 122, while the variable filter circuit 15 may be connected to the first end 121.

The variable terminator 13 is a variable impedance circuit that terminates the first end 121 of the sub-line 12 at a desired impedance. The variable terminator 13 is provided, for example, to improve the directivity of the directional coupler 2 by adjusting the isolation characteristics of the directional coupler 2. The variable terminator 13 is not restricted to a particular configuration. In one example, the variable terminator 13 may be constituted by a circuit including a variable capacitor and a variable resistor connected in parallel with each other. One end of the variable terminator 13 is connected to the first end 121 of the sub-line 12, while the other end is connected to a ground electrode.

The variable filter circuit 15 is a filter that can variably control the filter characteristics defined by the pass band of a signal to pass through the filter and the elimination band of a signal to stop from passing through the filter. In multiband communication in which communication is performed selectively using radio-frequency signals of multiple frequency bands, the variable filter circuit 15 allows a radio-frequency signal of a frequency band used for communication to pass therethrough and stops signals of the other frequency bands.

The variable filter circuit 15 is not restricted to a particular type. In one example, the variable filter circuit 15 may be a tunable filter that achieves desired filter characteristics by switching with switches multiple signal paths whose filter characteristics are different from each other.

FIGS. 2A, 2B and 2C show circuit diagrams illustrating a plurality of examples of the functional configuration of the variable filter circuit 15.

A variable filter circuit 15a shown in FIG. 2A includes a bypass path 150, a filter 151 in a filter path, and switches 160 and 161. Specifically, the bypass path 150 is a single wiring conductor without an impedance element. The impedance element is a capacitor, an inductor, or a resistor.

In the variable filter circuit 15a, the bypass path 150 or the path including the filter 151 is selected by the switch 160 or 161 to be connected to the second end 122 of the subline 12, and the signal transmission characteristics of the selected path, that is, the characteristics which determine the frequency band of a signal transmitted through each path, are the filter characteristics of the variable filter circuit 15a.

A variable filter circuit 15b shown in FIG. 2B is a filter circuit including filters 152 and 153 respectively in a filter path and switches 162 and 163 in addition to the elements of the variable filter circuit 15a. That is, the variable filter circuit 15b includes multiple filters.

In the variable filter circuit 15b, the signal transmission characteristics of the path selected by the corresponding one of the switches 160 through 163 from among the bypass path 150 and the paths including the corresponding filters 151 through 153 are the filter characteristics of the variable filter circuit 15b.

The variable terminator 13 and the variable filter circuit 15 are adjusted based on a control signal supplied via a control port CTL, for example. The control signal may be supplied from an external circuit, such as an RF signal processing circuit (not shown). The variable terminator 13 and the variable filter circuit 15 may independently be adjusted based on different control signals.

A variable filter circuit 15c shown in FIG. 2C is different from the variable filter circuit 15a in that switches 261, 361, and 461 are added to the path on which the filter 151 is disposed.

The switch 261 is connected in series between a ground and a node on the path connecting the filter 151 and the switch 361. The switch 361 is connected in series between the filter 151 and a node connecting the bypass path 150 and the path including the filter 151. The switch 461 is connected in series between a ground and a node on the path connecting the filter 151 and the switch 161.

The switches 161 and 361 are a first switch connected in series onto the path including the filter 151. The switches 161 and 361 are operated together. In the variable filter circuit 15c, to transmit a signal through the path including the filter 151 (to stop a signal from being transmitted through the bypass path 150), the switches 161 and 361 are turned ON together. In the variable filter circuit 15c, to stop a signal from being transmitted through the path including the filter 151 (to transmit a signal through the bypass path 150), the switches 161 and 361 are turned OFF together.

The switches 261 and 361 are operated mutually exclusively. The switches 461 and 161 are operated mutually exclusively. That is, when the switches 161 and 361 are ON, the switches 261 and 461 are OFF, and when the switches 161 and 361 are OFF, the switches 261 and 461 are ON. The switches 261 and 461 are a second switch connected in series between a ground and the filter path on which the filter 151 is arranged. In other words, the switches 261 and 461 are a second switch connected in series between a ground and a node on the path including the filter 151.

In the variable filter circuit 15c, the provision of the switches 261 and 461 can reduce the influence of the OFF capacitance Coff produced when the switches 161 and 361 are OFF on the main line 11 of the directional coupler 2.

This will be explained more specifically. The OFF capacitance Coff produced when the switches 161 and 361 disposed on the path including the filter 151 are OFF may cause ripples in the frequency characteristics of the main line 11. In contrast, in the variable filter circuit 15c, the switches 261 and 461 are provided on the path including the filter 151 so as to electrically connect a ground and a node on this path when the switches 161 and 361 are OFF. This reduces the influence of the OFF capacitance Coff of the switches 161 and 361 on the main line 11. It is thus less likely to cause ripples in the frequency characteristics of the main line 11.

Providing the switches 261 and 461 also enhances protection for the switches associated with the switches 261 and 461 (namely, the switch 361 associated with the switch 261 and the switch 161 associated with the switch 461) from ESD (Electro Static Discharge).

The variable filter circuit 15c can function as a variable filter circuit if only one of the switches 161 and 361 is provided on the path including the filter 151. In this case, disposing the corresponding one of the switches 261 and 461 can reduce the occurrence of ripples in the frequency characteristics of the main line.

In the variable filter circuits 15a, 15b, and 15c, if the switch 160 disposed on the bypass path 150 is provided on a substrate, as shown in FIG. 3, a bump GND (a mounting electrode disposed on the back side of the substrate) which is set to be a ground potential may be provided between an input terminal IN and an output terminal OUT of the switch 160. This configuration can enhance the isolation characteristics between the input terminal and the output terminal of the switch 160, thereby increasing the attenuation outside the pass band of the filter 151.

The substrate on which the switch 160 is disposed may be a substrate included in an external device on which the variable filter circuit is formed, and this external device is provided separately from an integrated circuit on which the directional coupler is formed. This configuration will be discussed later. The substrate on which the switch 160 is disposed may alternatively be a module substrate on which the external device including the variable filter circuit and the integrated circuit including the directional coupler are mounted. If the variable filter circuit is formed on the same integrated circuit as that including the directional coupler, the substrate may be a substrate included in the integrated circuit. The switch 160 is a third switch connected onto the bypass path 150.

The element disposed between the input terminal IN and the output terminal OUT of the switch 160 may be any element if it is a wiring element which is set to be a ground potential. That is, the element disposed between the input terminal IN and the output terminal OUT of the switch 160 may not necessarily be a bump GND and may be an electrode or wiring set to be a ground potential.

Advantages of the directional coupler 2 will be described below. In the following description, the directional coupler 2 will be discussed as an embodiment, and a directional coupler (not shown) in which a variable filter circuit is not disposed at the end of a sub-line at the coupling port will be discussed as a comparative example.

FIG. 4 is a graph illustrating an example of the degree of coupling of the directional coupler according to the comparative example. The solid line indicates the design value of the degree of coupling, while the broken line indicates the actual value of the degree of coupling. The design value in FIG. 4 represents the degree of coupling of the directional coupler 2 without a variable terminator and a variable filter (the directional coupler discussed as a comparative example), that is, the degree of coupling achieved when ideal impedance matching is provided at both ends of the sub-line 12. The actual value in FIG. 4 represents the degree of coupling obtained as a result of adjusting the impedance at the first end 121 of the sub-line by using the variable terminator 13 when the directional coupler 2 is mounted on a mounting substrate.

For example, when the directional coupler 2 is mounted on a mounting substrate, parasitic impedance is added to the second end 122 of the sub-line 12 at the coupling port CPL so as to cause impedance mismatching between the second end 122 and the first end 121 at the isolation port ISO. The parasitic impedance includes impedance due to wiring laid on the mounting substrate and ground capacitance. In this manner, if the impedance is deviated from the state in which impedance matching is provided between the first end 121 and the second end 122 of the sub-line 12, the directivity of the directional coupler 2 is degraded. In this case, adjusting the impedance at the first end 121 of the sub-line 12 with the variable terminator 13 can suppress the degradation of the directivity.

The degree of coupling obtained as a result of shifting the impedance at the first end 121 of the sub-line 12 from the ideal value with the variable terminator 13 is the degree of coupling shown as the actual value in FIG. 4. Using the variable terminator 13 can decrease a deviation of the isolation characteristics caused by parasitic impedance so as to maintain the directivity. On the other hand, however, using the variable terminator 13 may influence the degree of coupling of the directional coupler and deviate it from the design value, as shown in FIGS. 2A, 2B and 2C.

An example of the above-described situation is shown in FIG. 4. In FIG. 4, a first degree of coupling obtained when the terminating impedance at the first end 121 of the sub-line 12 is 50Ω and 0 pF is shown as the design value of the degree of coupling, while a second degree of coupling obtained when the terminating impedance at the first end 121 of the sub-line 12 is 60Ω and 2 pF is shown as the actual value of the degree of coupling.

Focusing on the degrees of coupling at the frequencies of 3.7 GHz and 4.8 GHz, for example, the design value and the actual value of the degree of coupling are different from each other at both the frequencies in FIG. 4.

In contrast, in the directional coupler 2 discussed as an embodiment, as a result of adjusting the impedance at the second end 122 of the sub-line 12 with the variable filter circuit 15, the loss of the sub-line is reduced so as to decrease a deviation of the degree of coupling from its design value.

Typically, to adjust the pass band of a signal to pass through a filter and the elimination band of a signal to stop from passing through the filter, it is necessary to adjust the impedance of the filter. Adjusting the impedance of the filter also changes the impedance components added to the path to which the filter is connected. That is, the variable filter circuit 15 that variably controls the filter characteristics also serves as a variable impedance circuit that adds desired impedance components to the path to which the variable filter circuit 15 is connected.

Hence, using the variable filter circuit 15 can adjust the impedance matching at the second end 122 of the sub-line 12, thereby suppressing the degradation of the detection accuracy.

Figure 5:
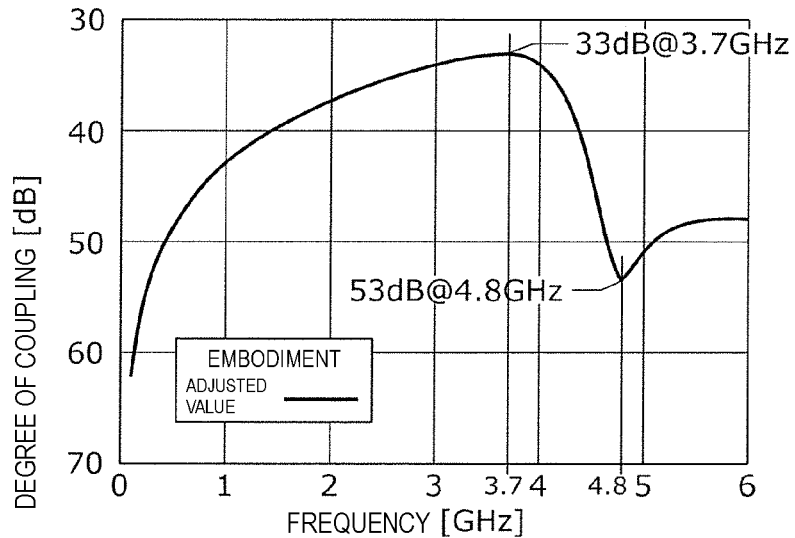
FIG. 5 is a graph illustrating an example of the degree of coupling of the directional coupler according to the first embodiment.

FIG. 5 is a graph illustrating an example of the degree of coupling of the directional coupler 2 according to the embodiment. The solid line indicates the adjusted value of the degree of coupling. The adjusted value in FIG. 5 is the degree of coupling obtained as a result of adjusting the impedance of the variable filter circuit 15 while setting the terminating impedance at the first end 121 of the sub-line 12 to be 60Ω and 2 pF, which is the same condition when the actual value in FIG. 4, is obtained.

FIG. 5 shows that, as a result of adjusting the impedance of the variable filter circuit 15, the directional coupler 2 achieves the degree of coupling substantially equivalent to that of the design value of the comparative example.

As described above, the directional coupler 2 is able to adjust the impedance of the sub-line 12 at the isolation port ISO with the variable terminator 13, as in the related art. This can prevent the entry of unwanted radio-frequency signals into the coupling port CPL, and the directivity can be stabilized. Additionally, the impedance mismatching at the coupling port CPL caused by the adjustment of the impedance at the isolation port ISO can be reduced by the adjustment of the variable filter circuit 15. This can stabilize the degree of coupling and suppress the degradation of the detection accuracy.

The following advantages are also achieved by the provision of the variable filter circuit 15.

In the following description, for the sake of convenience, it is assumed that the frequency band including the 900 MHz band is a low band LB and the frequency band including the 2.0 GHz band and the 3.5 GHz band is a high band HB.

Figure 6:
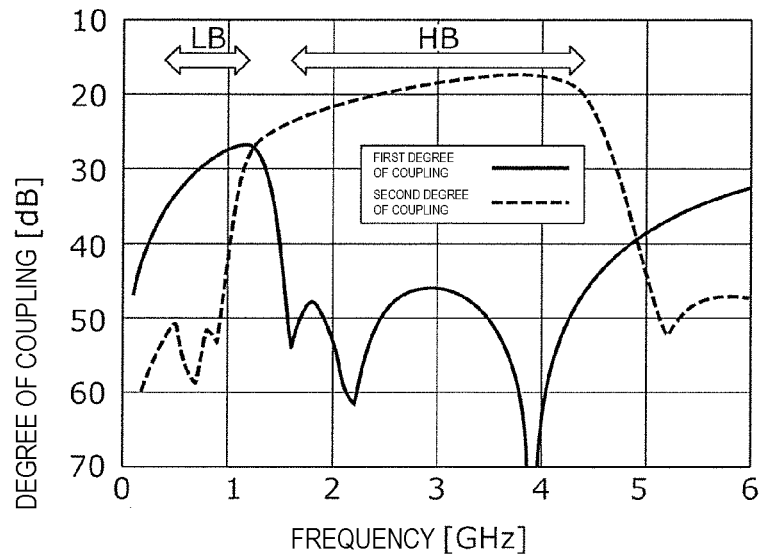
FIG. 6 is a graph illustrating an example of the degrees of coupling of the directional coupler according to the first embodiment.

FIG. 6 is a graph illustrating an example of the degrees of coupling of the directional coupler 2. The solid line indicates a first degree of coupling when the filter characteristics of the variable filter circuit 15 are set to be first filter characteristics. The broken line indicates a second degree of coupling when the filter characteristics of the variable filter circuit 15 are set to be second filter characteristics.

The first filter characteristics are characteristics used for detecting a radio-frequency signal in the low band LB and have the pass band in the low band LB and the elimination band in the high band HB. The second filter characteristics are characteristics used for detecting a radio-frequency signal in the high band HB and have the pass band in the high band HB and the elimination band in the low band LB. The filter characteristics are not shown in FIG. 6.

FIG. 6 shows that the degree of coupling outside the pass band is decreased in accordance with the filter characteristics. This can eliminate unwanted waves, that is, unwanted signal components contained in a radio-frequency signal in the direction to be detected and in a frequency band other than a frequency band to be detected, from a signal outputted from the coupling port CPL, thereby suppressing the degradation of the detection accuracy more effectively.

In the variable filter circuit 15, the bypass path 150 is provided and can be selected. As a result of selecting the bypass path 150 on which an impedance element is not disposed, the coupling port CPL is less likely to be influenced by the impedance change of the isolation port ISO, thereby suppressing the degradation of the detection accuracy even more effectively.

Second Embodiment

A directional coupler according to a second embodiment will be described below.

Figure 7:
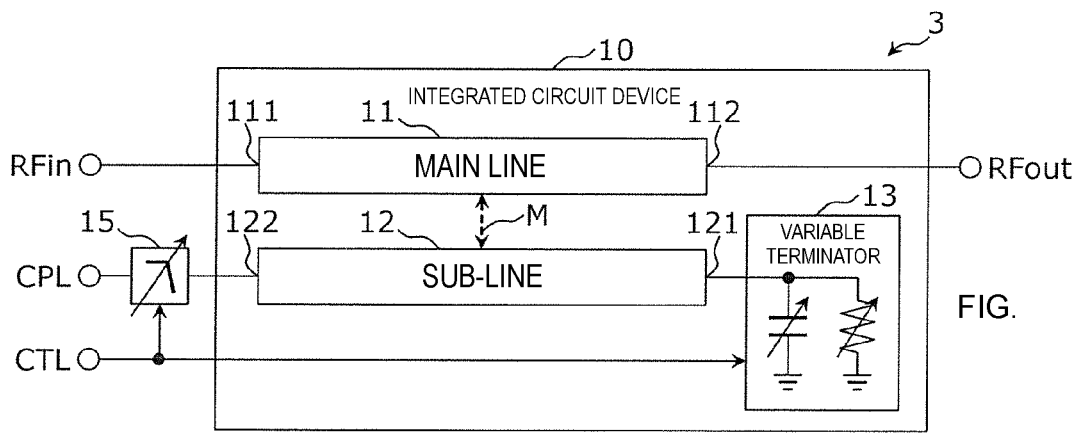
FIG. 7 is a circuit diagram illustrating an example of the functional configuration of a directional coupler according to a second embodiment.

FIG. 7 is a circuit diagram illustrating an example of the functional configuration of a directional coupler 3 according to the second embodiment. As shown in FIG. 7, the functional configuration of the directional coupler 3 is equivalent to that of the directional coupler 2 shown in FIG. 1. In the directional coupler 3, the main line 11, the sub-line 12, and the variable terminator 13 are formed as an integrated circuit device 10, while the variable filter circuit 15 is formed as a device provided separately from the integrated circuit device 10. The integrated circuit device is a mounting component formed by using a semiconductor manufacturing process, such as photolithography.

A variable control mechanism (a switch, for example) for controlling the variable filter circuit may be formed in the integrated circuit device.

Typically, lines formed by using a semiconductor manufacturing process are fine and achieve high dimensional accuracy. As a result of forming the main line 11 and the sub-line 12 in the integrated circuit device 10, it is possible to obtain a small-size, high-performance directional coupler 3 having only small manufacturing variations in the degree of coupling. In contrast, regarding a variable filter circuit, it is not possible to use a thick-film wiring having a low resistance to form a variable filter circuit in an integrated circuit device. It is thus highly likely that a variable filter circuit formed in an integrated circuit device has a low Q factor and exhibits poor characteristics.

To address this issue, the variable filter circuit 15 is formed in an external device provided separately from the integrated circuit device. The external device may be constituted by inductor, capacitor, and acoustic wave elements. By using an LC filter and an acoustic wave filter formed by these elements, the variable filter circuit 15 exhibiting a high Q factor can be formed.

Advantages of the directional coupler 3 will be described below. In the following description, the directional coupler 3 will be discussed as an embodiment, and a directional coupler (not shown) including a variable filter formed in the integrated circuit device 10 will be discussed as a comparative example. It is assumed that the variable filter circuit 15 has the low-band LB filter characteristics discussed in the second embodiment.

Figure 8:
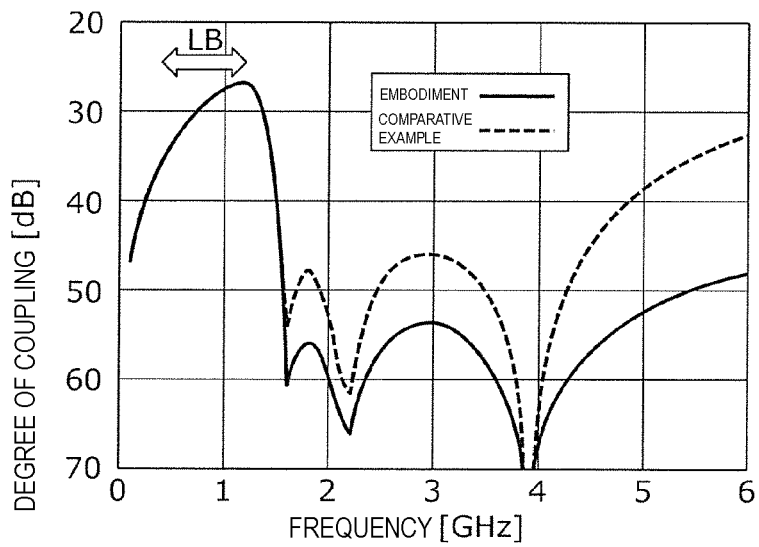
FIG. 8 is a graph illustrating an example of the degree of coupling of the directional coupler according to the second embodiment.

FIG. 8 is a graph illustrating an example of the degrees of coupling of the directional couplers. The solid line indicates the degree of coupling of the directional coupler 3, which is the embodiment, while the broken line indicates the degree of coupling of the directional coupler, which is the comparative example. FIG. 8 shows that the directional coupler 3 exhibits higher attenuation outside the pass band than the directional coupler of the comparative example in which the variable filter is formed in the integrated circuit device 10. The directional coupler 3 of the embodiment is able to more effectively eliminate unwanted waves from a signal outputted from the coupling port CPL, thereby enhancing the advantage of suppressing the degradation of the detection accuracy.

Third Embodiment

A directional coupler according to a third embodiment will be described below.

Figure 9:
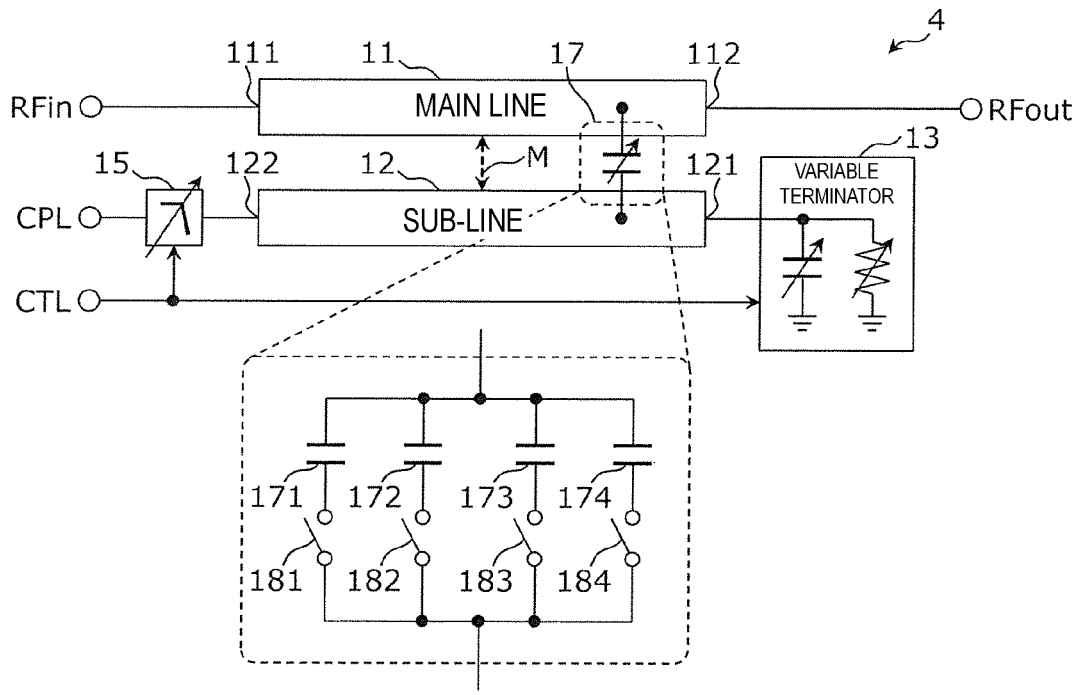
FIG. 9 is a circuit diagram illustrating an example of the functional configuration of a directional coupler according to a third embodiment.

FIG. 9 is a circuit diagram illustrating an example of the functional configuration of a directional coupler 4 according to the third embodiment. As shown in FIG. 9, the directional coupler 4 includes a variable capacitor 17 in addition to the elements of the directional coupler 2 shown in FIG. 1.

The variable capacitor 17 is connected between the main line 11 and the sub-line 12. The variable capacitor 17 is not limited to a particular configuration. For example, the variable capacitor 17 may be constituted by plural capacitors 171 through 174 connected in parallel with each other and plural switches 181 through 184 connected in series with the respective capacitors. In this configuration, the capacitance of the variable capacitor 17 is changed as a result of switching between the switches 181 through 184.

In the directional coupler 4, as a result of providing the variable capacitor 17 in addition to the variable filter circuit 15, the degree of coupling can be adjusted in a wider range, thereby suppressing the degradation of the detection accuracy more reliably. For example, if a desired degree of coupling is not achieved by the adjustment of the variable filter circuit 15, another degree of coupling may be added to the directional coupler 4 in accordance with the capacitance of the variable capacitor 17.

Fourth Embodiment

A directional coupler according to a fourth embodiment will be described below.

Figure 10:
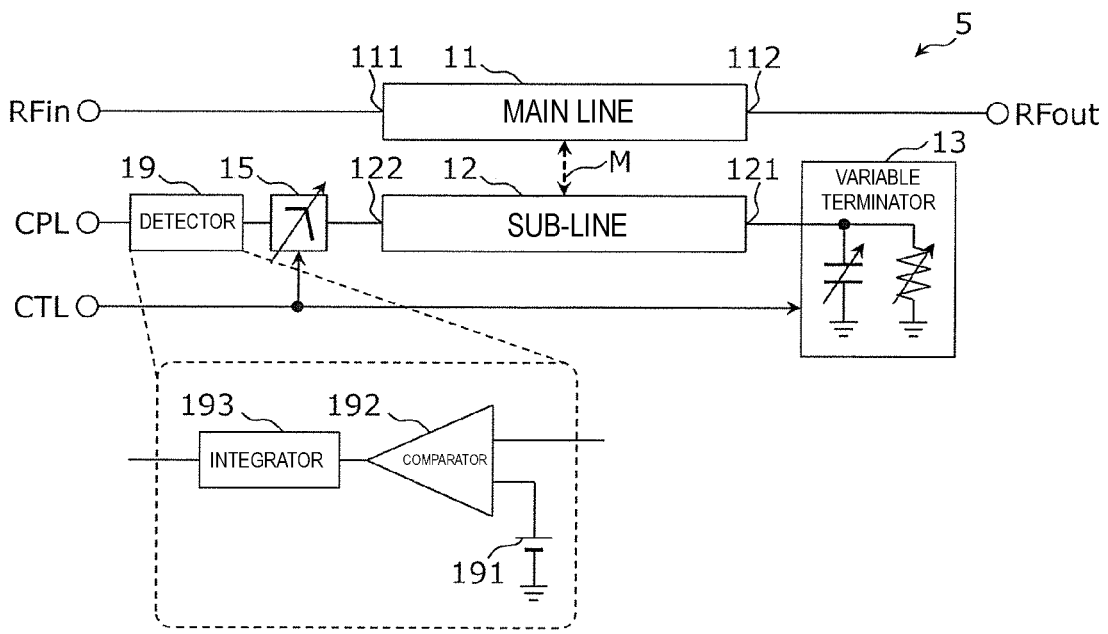
FIG. 10 is a circuit diagram illustrating an example of the functional configuration of a directional coupler according to a fourth embodiment.

FIG. 10 is a circuit diagram illustrating an example of the functional configuration of a directional coupler 5 according to the fourth embodiment. As shown in FIG. 10, the directional coupler 5 includes a detector 19 in addition to the elements of the directional coupler 2 shown in FIG. 1.

The detector 19 is connected to the second end 122 of the sub-line via the variable filter circuit 15. From a signal supplied from the second end 122 of the sub-line via the variable filter circuit 15, the detector 19 generates a detection signal representing the level of this signal. The detector 19 is not limited to a particular configuration, and may be constituted by a reference voltage source 191, a comparator 192, and an integrator 193, for example.

In the directional coupler 5, as a result of inputting a radio-frequency signal whose level is already known into the input port RFin, the degree of coupling can be measured from a detection signal generated by the detector 19. This makes it possible to adjust the variable filter circuit 15 in accordance with the difference between the measured value and the design value of the degree of coupling.

In the directional coupler 5, the provision of the detector 19 can adjust the degree of coupling more accurately, thereby suppressing the degradation of the detection accuracy more effectively.

In a communication apparatus using the directional coupler 5 and including an amplifier, it is possible to perform feedback control on the gain of the amplifier in accordance with a detection signal generated by the detector 19.

Conclusions

As described above, a directional coupler according to an aspect of the present disclosure includes a main line, a sub-line, a variable impedance circuit, and a variable filter circuit. The variable impedance circuit terminates one end portion of the sub-line. The variable filter circuit is connected to the other end portion of the sub-line.

With this configuration, the directivity can be stabilized by adjusting the variable impedance circuit. Additionally, as a result of adjusting the variable filter circuit, the impedance mismatching at a coupling port can be decreased and unwanted waves can be eliminated, thereby suppressing the degradation of the detection accuracy.

The variable filter circuit may include a filter, a bypass path, and a switch. The switch is connected to at least one of the filter and the bypass path.

With this configuration, if the bypass path on which an impedance element is not disposed is selected, the other end portion of the sub-line is less likely to be influenced by the impedance change of one end portion of the sub-line, thereby suppressing the degradation of the detection accuracy even more effectively.

The directional coupler may include a plurality of the above-described switches. The plurality of the switches may include first and second switches. The first switch is connected in series onto a path on which the filter is disposed. The second switch is connected in series between a ground and a node on the path on which the filter is disposed.

The first switch and the second switch may be operated mutually exclusively.

With this configuration, the influence of the OFF capacitance produced when the first switch is OFF can be decreased by turning ON the second switch. It is thus less likely to cause ripples in the frequency characteristics of the main line.

The above-described plurality of the switches may include a third switch connected in series onto the bypass path. The third switch may be disposed on a substrate. A wiring element may be disposed between an input terminal and an output terminal of the third switch, in a plan view of the substrate. The wiring element is set to be a ground potential.

With this configuration, the wiring element set to be a ground potential can enhance the isolation characteristics between the input terminal and the output terminal of the third switch disposed on the bypass path, thereby increasing the attenuation outside the pass band of the path on which the filter is disposed.

The variable filter circuit may include a plurality of filters.

With this configuration, as a result of selecting from among more characteristics in the variable filter circuit, the precision in adjusting the characteristics can be enhanced. This can suppress the degradation of the detection accuracy even more effectively.

The main line, the sub-line, and the variable impedance circuit may be formed as an integrated circuit device. The variable filter circuit may be formed as an element provided separately from the integrated circuit device.

With this configuration, the variable filter can be formed by using an external element having a relatively high Q factor, thereby suppressing the degradation of the detection accuracy even more effectively.

The directional coupler may further include a variable capacitor connected between the main line and the sub-line.

With this configuration, the degree of coupling of the directional coupler can be adjusted in a wider range, thereby suppressing the degradation of the detection accuracy more reliably.

The directional coupler may further include a detector that is connected to the other end portion of the sub-line.

With this configuration, the degree of coupling can be measured based on the output from the detector and be adjusted in accordance with the measurement result, thereby suppressing the degradation of the detection accuracy more reliably.

The directional couplers of the present disclosure have been discussed through illustration of embodiments. However, the present disclosure is not restricted to the above-described embodiments. Modified examples obtained by making various modifications to the above-described embodiments by those skilled in the art and other embodiments implemented by combining certain elements in some of the embodiments without departing from the scope and spirit of the disclosure may also be encompassed in one or plural aspects of the present disclosure.

The present disclosure can be widely used as a directional coupler.

2, 3, 4, 5 directional coupler
10 integrated circuit device
11 main line
12 sub-line
13 variable terminator
15, 15a, 15b, 15c variable filter circuit
17 variable capacitor
19 detector
111 first end of main line
112 second end of main line
121 first end of sub-line
122 second end of sub-line
150 bypass path
151, 152, 153 filter
160, 161, 162, 163, 181, 182, 183, 184, 261, 361, 461 switch
171, 172, 173, 174 capacitor
191 reference voltage source
192 comparator
193 integrator

The invention claimed is:
1. A directional coupler comprising:
a main line;
a sub-line;
a variable impedance circuit configured to terminate a first end of the sub-line; and
a variable filter circuit that is connected to a second end of the sub-line,
wherein the variable filter circuit comprises:
a filter in a filter path;
a bypass path;
a first switch connected in series in the filter path;
a second switch connected between ground and the filter path; and
a third switch connected in series in the bypass path, wherein the variable filter circuit is configured to selectively connect the second end of the subline to the filter and the filter path, or to the bypass path, wherein the third switch is on a substrate, wherein as seen in a plan view of the substrate, a wiring element is between an input terminal and an output terminal of the third switch, and wherein the wiring element has a ground potential.

2. The directional coupler according to claim 1, wherein the first switch and the second switch are configured to operate mutually exclusively.

3. The directional coupler according to claim 1, wherein:

the variable filter circuit comprises a plurality of filters connected in parallel with each other in different filter paths; and the variable filter circuit is configured to selectively connect the second end of the subline to at least one of the filters and corresponding filter paths, or to the bypass path.

4. The directional coupler according to claim 1, wherein:

the main line, the sub-line, and the variable impedance circuit are parts of an integrated circuit device; and the variable filter circuit is separate from the integrated circuit device.

5. The directional coupler according to claim 1, further comprising:

a variable capacitor connected between the main line and the sub-line.

6. The directional coupler according to claim 1, further comprising:

a detector connected to the second end of the sub-line.

7. The directional coupler according to claim 1, wherein the second switch is connected to the filter path between the filter and the first switch.

* * * * *